US009165645B2

(12) United States Patent
Miao et al.

(10) Patent No.: US 9,165,645 B2
(45) Date of Patent: Oct. 20, 2015

(54) HIGH-RELIABILITY HIGH-SPEED MEMRISTOR

(75) Inventors: Feng Miao, Mountain View, CA (US); Jianhua Yang, Palo Alto, CA (US); John Paul Strachan, Millbrae, CA (US); Wei Yi, Mountain View, CA (US); Gilberto Medeiros Ribeiro, Palo Alto, CA (US); R Stanley Williams, Portola Valley, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 124 days.

(21) Appl. No.: 14/127,873

(22) PCT Filed: Jun. 24, 2011

(86) PCT No.: PCT/US2011/041881
§ 371 (c)(1),
(2), (4) Date: Dec. 19, 2013

(87) PCT Pub. No.: WO2012/177265
PCT Pub. Date: Dec. 27, 2012

(65) Prior Publication Data
US 2014/0112059 A1   Apr. 24, 2014

(51) Int. Cl.
*G11C 13/00* (2006.01)
*H01L 45/00* (2006.01)
(52) U.S. Cl.
CPC ............ *G11C 13/0011* (2013.01); *H01L 45/08* (2013.01); *H01L 45/1233* (2013.01); *H01L 45/146* (2013.01)
(58) Field of Classification Search
CPC .............................. G11C 13/0011; H01L 45/08

USPC .......................................................... 365/148
See application file for complete search history.

(56) References Cited

U.S. PATENT DOCUMENTS 7,453,081 B2   11/2008 Happ et al.
7,550,802 B2    6/2009 Koyanagi et al.
(Continued)

FOREIGN PATENT DOCUMENTS

JP       2001203409       7/2001
WO   WO-2010068221 A1    6/2010
(Continued)

OTHER PUBLICATIONS

Supplementary European Search Report, Sep. 15, 2014, European Patent Application No. 11868115.4, 3 pages.
(Continued)

*Primary Examiner* — Hoai V Ho
*Assistant Examiner* — Tri Hoang
(74) *Attorney, Agent, or Firm* — Hewlett-Packard Patent Department

(57) ABSTRACT

A memristor has a first electrode, a second electrode parallel to the first electrode, and a switching layer disposing between the first and second electrodes. The switching layer contains a conduction channel and a reservoir zone. The conduction channel has a Fermi glass material with a variable concentration of mobile ions. The reservoir zone is laterally disposed relative to the conduction channel, and functions as a source/sink of mobile ions for the conduction channel. In the switching operation, under the cooperative driving force of both electric field and thermal effects, the mobile ions are moved into or out of the laterally disposed reservoir zone to vary the concentration of the mobile ions in the conduction channel to change the conductivity of the Fermi glass material.

15 Claims, 5 Drawing Sheets

(56) References Cited

U.S. PATENT DOCUMENTS

| | | | |
|---|---|---|---|
| 2007/0120124 A1 | 5/2007 | Chen et al. | |
| 2008/0079029 A1* | 4/2008 | Williams | 257/213 |
| 2008/0090337 A1* | 4/2008 | Williams | 438/133 |
| 2010/0155686 A1 | 6/2010 | Bratkovski et al. | |
| 2011/0017977 A1* | 1/2011 | Bratkovski et al. | 257/14 |
| 2011/0038196 A1 | 2/2011 | Tour et al. | |
| 2011/0073828 A1 | 3/2011 | Xia et al. | |

FOREIGN PATENT DOCUMENTS

| | | |
|---|---|---|
| WO | WO-2010074685 A1 | 7/2010 |
| WO | WO-2010087836 A1 | 8/2010 |

OTHER PUBLICATIONS

International Search Report, Feb. 17, 2012, Hewlett-Packard Development Company, L.P., PCT Application No. PCT/US2011/041881, Filed Jun. 24, 2011.

Kiazadeh, A. et al., Symposium Q: New Functional Materials and Emerging Device Architectures for Nonvolatile Memories-Planar Non-volatile Memory based on Metal Nanoparticles, (Research Paper), Apr. 25-29, 2011.

Yang et al., High switching endurance in TaOx memristive devices, Applied Physics Letters, Dec. 2010, vol. 97, No. 23, pp. 232102-1 to 232102-3.

* cited by examiner

HIGH-RELIABILITY HIGH-SPEED MEMRISTOR

BACKGROUND

Current memory technologies, including DRAM (dynamic random access memory), SRAM (static RAM) and NAND Flash, are quickly approaching their scalability limits. Accordingly, there is a strong need for new memory technologies that can meet the performance requirements of future memory applications. Resistive RAM, which is a type of memristor, is a promising technology and has been shown to exhibit great scalability, non-volatility, multiple-state operation, 3D stackability, and CMOS compatibility. There have been, however, challenges in improving the performance of such devices, such as device endurance, thermal stability, and switching speed.

BRIEF DESCRIPTION OF THE DRAWINGS

Some embodiments of the invention are described, by way of example, with respect to the following figures.

DETAILED DESCRIPTION

As described below, the inventors of the present invention have discovered a unique new structure of memristors. The unique structure of the memristors, coupled with a unique switching mechanism, allows the devices to provide significantly improved performance characteristics over previously know switching devices, including much improved endurance, low switching energy, and fast switching speed.

Figure 1:
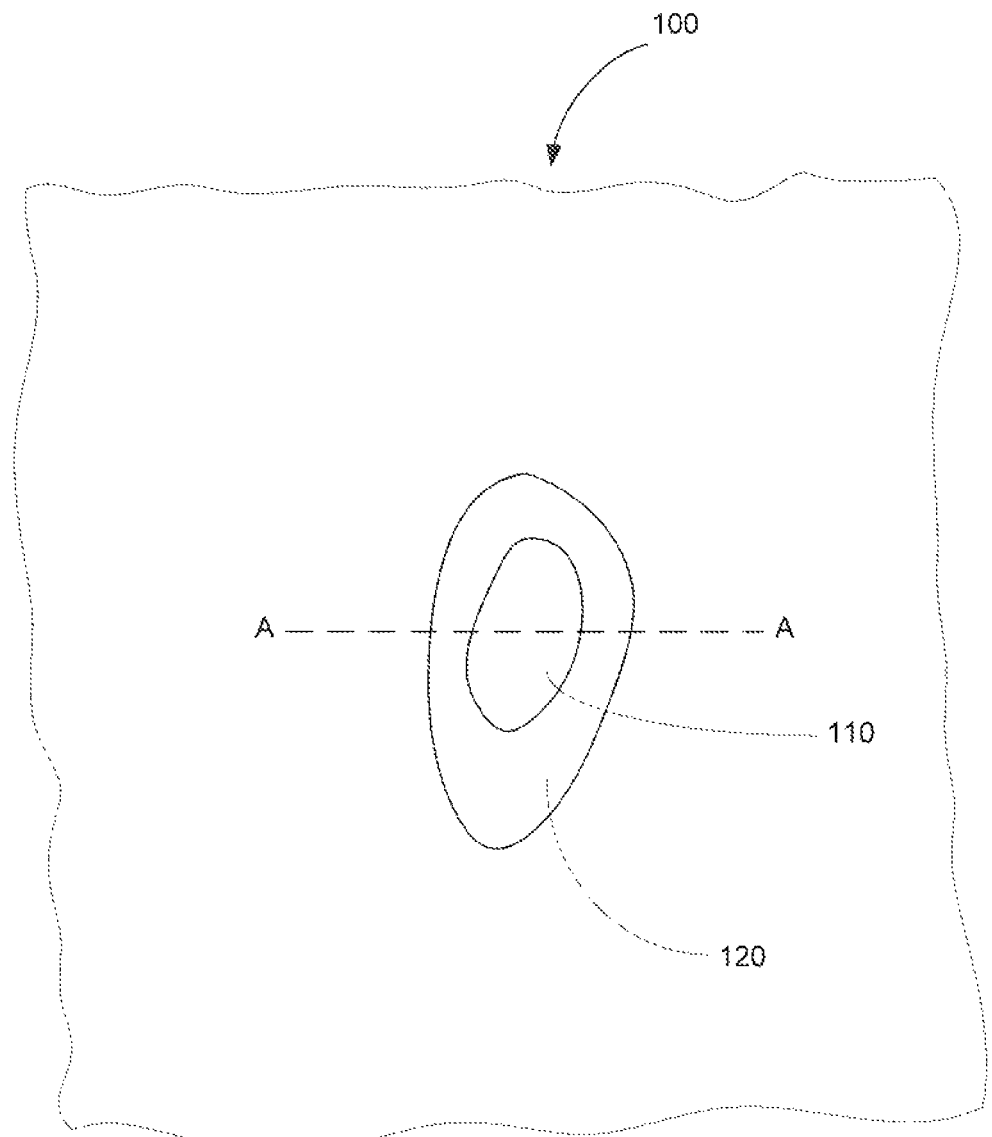
FIG. 1 is a schematic illustration of a top view of a high-endurance, high-speed, and low-energy memristor in accordance with an embodiment of the invention.

FIG. 1 shows in a schematic form a top view of a sample of a memristor 100 according to an embodiment of the invention. The sample device 100 has a top electrode formed of Ta, a bottom electrode formed of Pt, and a switching layer disposed between the top and bottom electrodes. In the device fabrication process, the switching layer is formed to contain amorphous $Ta_2O_5$. As described in greater detail below, however, the composition of the switching layer is changed when the device has been operated. The device demonstrated high enduring by remaining switchable even after 15 billion ON-OFF cycles without any feedback or power-limiting circuits. The device was switchable using a relatively low voltage, less than 2V, for both the ON switching and OFF switching. Furthermore, the switching time for both ON and OFF was less than 2 nanoseconds. As a result, the device exhibits a very low switching energy (<1 pJ).

The top view in FIG. 1 is a schematic presentation of an image obtained by means of Pressure-modulated Conductance Microscopy (PCM). The PCM image was taken by using a non-conducting Atomic Force Microscopy (ATM) tip to apply pressure to the top electrode of the sample device 100, and simultaneously monitoring the change of resistance of the device at a small current bias. This yielded a resistance map as a function of the AFM tip position. The resistance variation in the map allows a conduction channel in the switching layer of the device to be identified. As shown in FIG. 1, it has been found that the switching layer has a well-defined conduction channel 110. The observed conduction channel has a dimension on the nanoscale, and is around 100 nm for the sample device. Surrounding the nanoscale conduction channel 110 is a generally annular region 120 which, as described below, is a reservoir zone that functions as a source/sink of mobile ion species for the conduction channel 110. As will be described in greater detail below, the switching mechanism involves the movement of mobile ion species between the conduction channel 110 and the laterally disposed reservoir zone 120, which allows for the improved switching characteristics such as high speed, low energy, and high endurance.

After the location of the conduction channel 110 in the switching layer of the sample device is identified by the PCM technique, the sample device is cross-sectionally cut along the line A-A in FIG. 1 using Focused Ion Beam (FIB). The structure and composition of the conduction channel and its surrounding regions are then examined using Cross-sectional Transmission Electron Microscopy (X-TEM) and Electron Energy-Loss Spectroscopy (EELS). Based on the physical characterizations using those techniques, an understanding of the conduction channel region as well as the switching mechanism has been formed.

Figure 2:
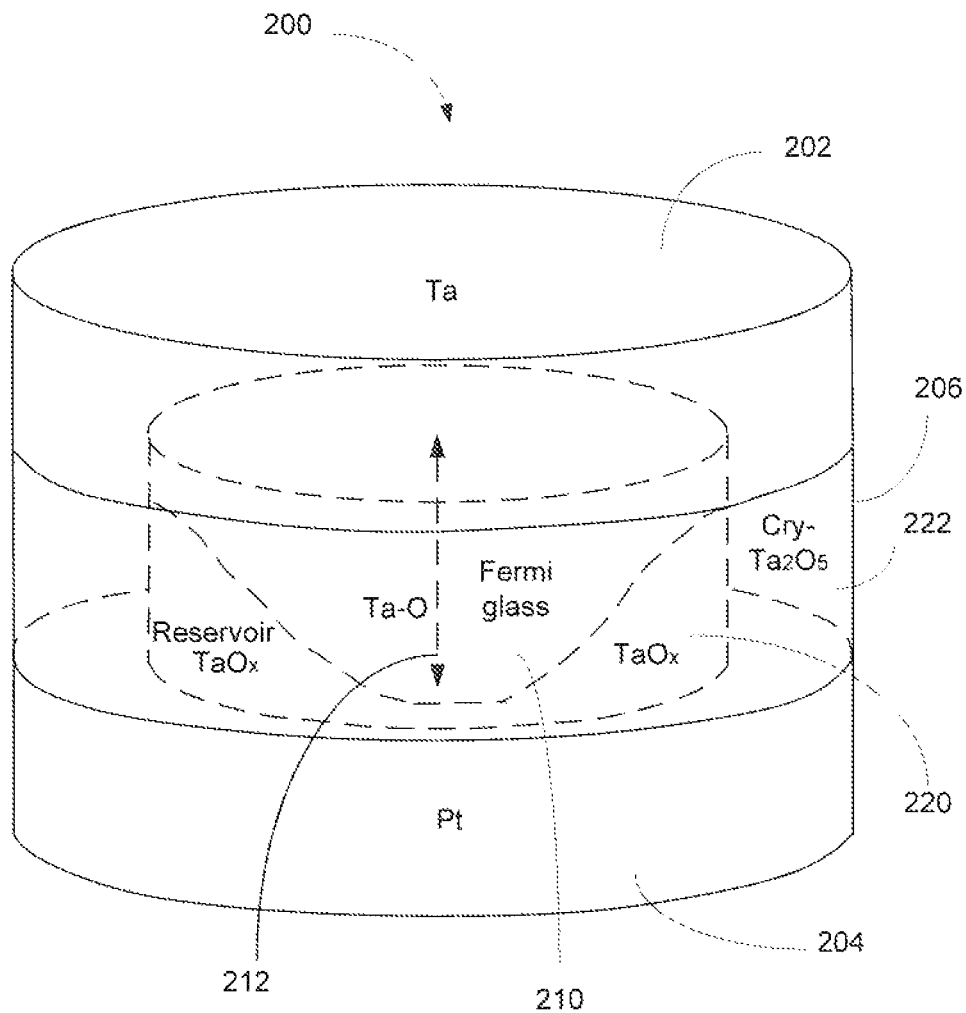
FIG. 2 is a schematic perspective view of a memristor that has a unique new structure and a new switching mechanism in accordance with an embodiment of the invention.

FIG. 2 is a schematic view of the structure and composition of a memristor 200 with a unique new structure according to the invention. The device has a top electrode 202, a bottom electrode 204 that is generally parallel to the top electrode, and a switching layer 206 disposed between the electrodes. The switching layer 206 includes a nanoscale conduction channel 210 between the top and bottom electrodes. As used herein, the word "nanoscale" means that the dimension of the item is on the scale of nanometers. In some embodiments, the conduction channel 210 may have the shape of a truncated cone, as illustrated in FIG. 2, such that it is wider near the top electrode 202 and narrower towards the bottom electrode 204. Adjacent the conduction channel 210 is a reservoir zone 220 that is capable of providing or absorbing mobile ions of a selected species. In this embodiment, the reservoir zone 220 is a generally annular region surrounding the conduction channel 210. The reservoir zone 220 is disposed laterally with respect to the conduction channel 210 in that it is to the side, rather than being in series along the vertical center line 212 of the conduction channel 210 between the top and bottom electrodes. This is a surprising feature, which is drastically different from previously known memristors (e.g., devices based on titanium oxide as the switching material). As explained below, it is believed that this feature is linked to a unique switching mechanism that allows the memristor 200 to have multiple desirable switching characteristics.

The conduction channel 210 contains a material that behaves as a "Fermi glass." The Fermi glass material is capable of going through a composition-induced metal-insulator transition as a function of the concentration of the species of mobile ions that are sourced or sunk by the lateral reservoir zone. As a result, the conduction channel 201 may be put in a high-resistance state (the OFF state) or a low-resistance state (the ON state) by adjusting the concentration of the mobile ions in the Fermi glass material. Another property that can be used to identify a Fermi glass is the sign (or polarity) of the temperature coefficient of its conductivity as a function of the mobile ion concentration.

In this regard, there are many different Fermi glasses that could be used as the material in the conduction channel for switching. They include oxides, nitrides, sulfides, phosphorides, carbides, boronides, fluorides, chalcogenides, etc., which could be binary, ternary, quaternary or more components. Some examples of such Fermi glass materials include $TaO_x$, $HfO_x$, $ZrO_x$, $YO_x$, $ErO_x$, $SmO_x$, $ScO_x$, $GdO_x$, $TiO_x$, $MnO_x$, $SnO_x$, $CrO_x$, $WO_x$, $NbO_x$, $MoO_x$, $VO_x$, $CoO_x$, $FeO_x$, $NiO_x$, $ZnO_x$, $MgO_x$, $CaO_x$, $AlO_x$, $SiO_x$, $GaO_x$, $AlN_x$, $GaN_x$, $SiN_x$, $SiC_x$, $BC_x$, $Ag_xS$, $Cu_xS$, $BN_x$, $SrTiO_{3-x}$, $CaZrO_{3-x}$, $LiTiO_x$, PCMO ($Pr_{0.7}Ca_{6.3}MnO_x$), etc. with $0<x\leq3$.

Figure 3:
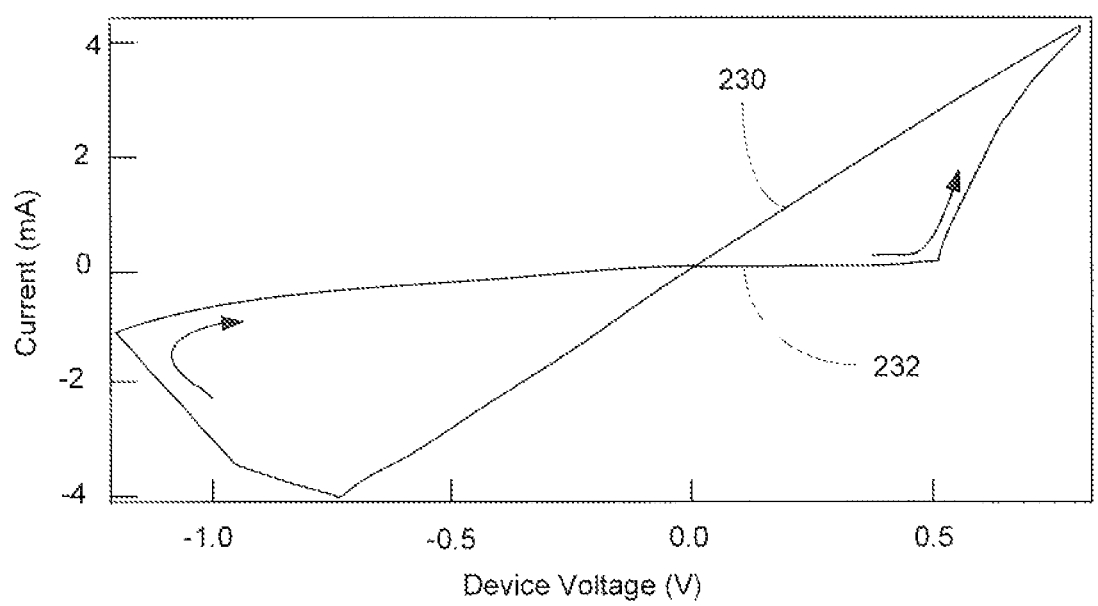
FIG. 3 is an example of an I-V curve of the high-endurance, high-speed, and low-energy memristor of FIG. 1.
Figure 4:
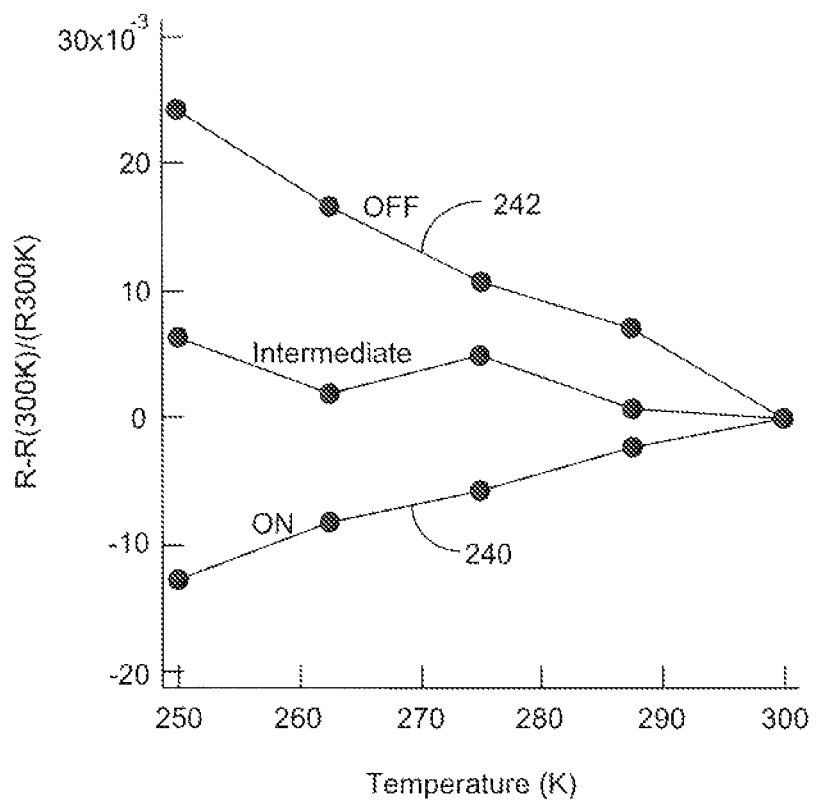
FIG. 4 is a chart showing temperature coefficients of the resistance of the material in the conduction channel of the memristor of FIG. 1.

Based on the information obtained from analyzing the sample device 100 as described above, in one embodiment, the conduction channel 210 contains a solid solution of tantalum and oxygen, although the concentration of oxygen may exceed the 20% limit as provided by a textbook phase diagram for Ta. The Ta—O solid solution remains amorphous. The tantalum-oxygen solid solution may alternatively be viewed as an amorphous film of tantalum oxide with the tantalum therein having multiple valence values. In this case, the Ta—O solid solution behaves as a Fermi glass, with oxygen anions ($O^{2-}$) as the mobile ion species. A relatively small change in the $O^{2-}$ concentration may cause significant change in the overall conductivity of the Ta—O solid solution. In the low-resistance state (LRS) or ON state, the Ta—O solution in the conductive channel exhibits metallic behavior, evidenced by the linear I-V curve segment 230 in the ON state in FIG. 3 and positive thermal coefficient of resistance (TCR) as shown by the slope of the line 240 for the ON state in FIG. 4. The OFF state also shows an almost linear I-V curve segment 232 in FIG. 3, but with a negative TCR as shown by the line 242 for the OFF state in FIG. 4.

The Fermi-glass behavior of the Ta—O solid solution is confirmed by studies of the conductivity changes of such material as a function of $O^{2-}$ concentration and also the sign change of the temperature coefficient of resistance (TCR) from positive on the metallic side to negative on the insulating side of the transition. Based on matching the TCR with the reference films of Ti—O films with different oxygen concentrations, the averaged oxygen concentration value of the conduction channel has been determined to be approximately 15±5 atomic % for the ON state, 23±5 atomic % for the intermediate state, and 54±5 atomic % for the OFF state. The annular source/sink zone surrounding the conduction channel is formed of tantalum oxide ($TiO_x$), the composition of which is expected to be close to $Ta_2O_5$. The region 222 immediately adjacent to the reservoir zone 220 contains largely $Ta_2O_5$ and some portions have been observed to have been crystallized (a high-temperature tetragonal α-$Ta_2O_5$ phase), evidencing significant heating caused by the switching operations. The remaining portion of the switching layer outside the crystallized $Ta_2O_5$ region 222 is amorphous $Ta_2O_5$ (as grown).

Figure 5:
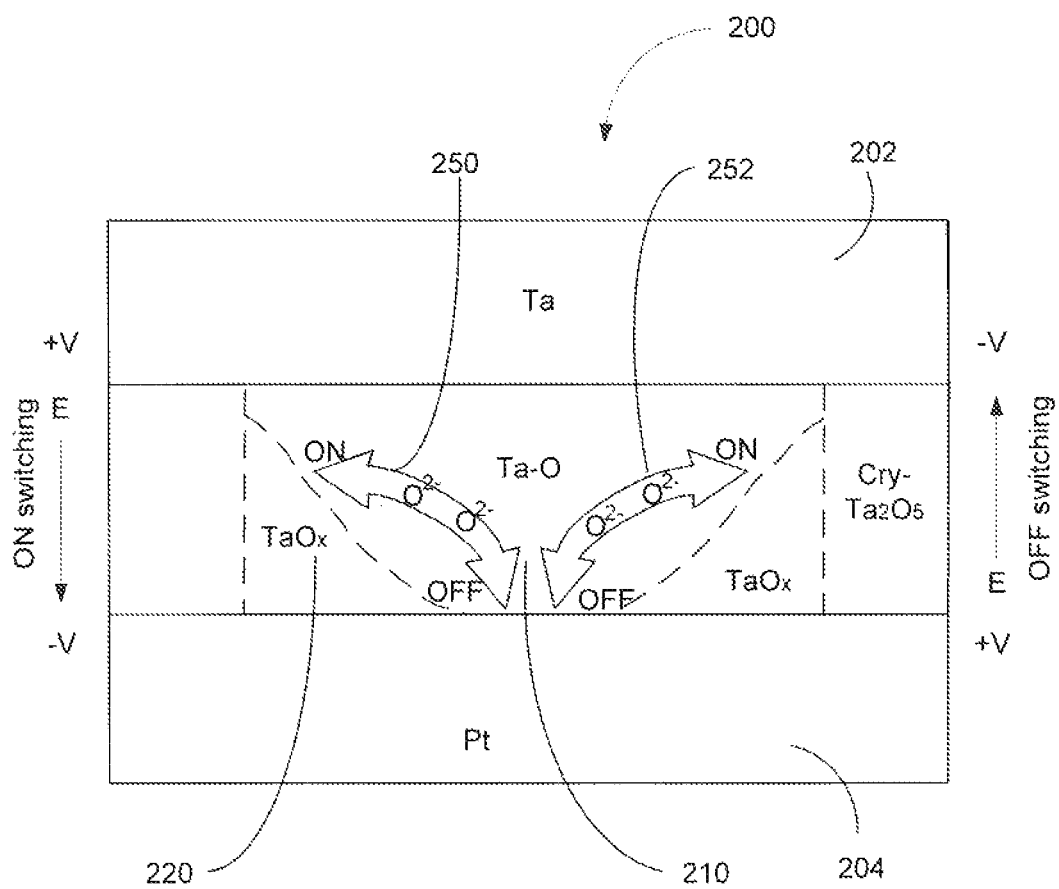
FIG. 5 is a schematic cross-sectional view of the memristor structure of FIG. 2 with illustrations of the new switching mechanism.

The structural and compositional analyses of the new memristor reveal a unique switching mechanism which is very different from that of previously known rnemristors. The new switching mechanism is explained here by way of example using a device based on Ta—O as the channel material. As shown in FIG. 5, the active region of the device has a conduction channel 210 surrounded in the bottom portion by a lateral reservoir zone 220 of tantalum oxide ($TaO_x$). The device 220 may be turned from ON to OFF, or from OFF to ON, by changing the concentration of the $O^{2-}$ anions in the Ta—O solid solution in the conduction channel 210, which behaves as a Fermi glass. In other words, the device 200 is switched by means of composition-induced conductivity changes in the material, in the conductive channel 210.

The switching is bipolar in that the ON-switching voltage and the OFF-switching voltage have opposite polarities. To switching the device from the OFF (HRS) state to the ON (LRS) state, a positive voltage is applied to the top electrode 202, while the bottom electrode 204 is equivalently negatively biased, as illustrated in the left side of FIG. 5. The resultant electric field E drives the oxygen anions upward. At the same time, a steep temperature gradient is produced by Joule heating of the electronic current in the OFF state, causing the Soret effect, also known as thermophoresis. Thermophoresis is the diffusion of mobile species (such as atoms, ions, or vacancies) in a steep temperature gradient, under which dilute vacancies (e.g., oxygen vacancies) can preferentially diffuse toward the higher temperature. In this case, the thermophoresis effect causes oxygen vacancies to diffuse radially inward from the reservoir zone 220 towards the center of the conductive channel 210. An equivalent view is that the oxygen anions are diffusing outward from the conduction channel 210 towards the lateral reservoir 220. Thus, oxygen anions drift upward from the lower part of the conduction channel due to the applied electric field, and are then swept radially out of the channel to the lateral reservoir. Due to the combined or cooperative effects of the vertical drifting caused by the electric field and the lateral diffusion caused by thermophoresis, the oxygen anions $O^{2-}$ move along a non-linear path out of the lower portion of the conductive channel, as illustrated by the curved arrows 250 and 252. The reduction of the oxygen concentration in the conduction channel 210 results in a low resistance, thereby putting the device in the ON state.

To turn the device from the ON state to the OFF state, a positive switching voltage is applied to the bottom electrode, as illustrated in the right side of FIG. 5. Thus, the electric field for OFF-switching is opposite to that of ON-switching. As the device starts in the ON state, the initial switching current through the conduction channel 210 is large. The high power causes the conduction channel 210 and its surrounding to heat up. The higher electrical and thermal conductivity of the channel in the ON state distributes the heat more uniformly as power is applied to the device. As a result, the resulting temperature gradient is flatter (in contrast with the large gradient during the OFF switching), which enables rapid Fick diffusion of oxygen anions $O^{2-}$ from the lateral reservoir zone 220 (high concentration) towards the center of the conduction channel (low concentration). The diffused oxygen anions are simultaneously driver downward by the electric field E generated by the switching voltage. The general path of the oxygen anions is illustrated by the curved arrows 250 and 252. As a result, the oxygen concentration in the lower part of the conduction channel 210 is replenished, causing the resistivity of the Ta—O solid solution to increase significantly, thereby putting the device in the OFF or HRS state. Again, as in the ON-switching operation, the exchange of mobile oxygen anions between the lateral reservoir 220 and the lower portion of the conduction channel 210 is the main mechanism for the switching.

The switching mechanism described above utilizes a lateral reservoir disposed to the side of the conduction channel to source or sink the mobile ions to cause composition-induced conductivity changes. It should be noted that this switching mechanism does not involve a tunneling gap reduction (for ON switching) or increase (for OFF switching), as there is no tunneling gap in this picture. This makes the new switching mechanism very different from the switching mechanism bases on the adjustment of a tunnel gap as found for other known switching oxides.

It is also significantly different from the other known memristors, such as titanium oxide-based devices, where the ion source/sink is in series of the conduction channel (i.e., disposed along the axis or the electric field from one electrode to the other). Since the switching part of the channel dominates the electron transport, a reservoir in series is normally more conductive than the switching part of the channel, and consists of more oxygen vacancies (in the Ti—O case), while a reservoir in parallel is normally more resistive than the switching part of the channel and consists of more oxygen anions (in the Ta—O case). Therefore, the thermal diffusion favors the OFF switching of the latter (parallel) but not the former (series). In fact, thermal diffusion significantly slows down the OFF switching in Ti—O based devices due to its opposite driving direction to electric field, resulting in orders of magnitude slower OFF switching in some of those systems. Also, in order to obtain a fast OFF switching (e.g., 10 ns), significantly larger power is required, which makes OFF switching the most power hungry process in those devices.

In contrast, with the new device structure and mechanism, as described above with the Ta—O switching system as an embodiment, electric field and thermal effect are cooperatively combined together, leading to ultra-fast switching speeds, where the same low magnitude of voltage is used to switch the device for both ON and OFF switching at similar speeds. This further enables a much lower operation energy for such type of devices, where sub-10 µA current may be used to switch a 50 nm×50 nm device as compared with over 100 µA current for a Ti—O nanodevice.

The Ta—O system has been described above as one embodiment of the new device structure/composition that provides highly reliable memristors. Other systems, however, are expected to exhibit a similar structure and switching behavior, and are thus within the scope of the invention. As one example, a Hf—O system may exhibit the structure and switching mechanism as described above in connection with the Ta—O system. It is believed that the reliability of the memristor is directly linked to the thermodynamic stability of the conduction channel during the switching process. Thus, the system used may benefit from being a simple binary one, with a minimum number of thermodynamically stable phases in equilibrium, such as two.

In the foregoing description, numerous details are set forth to provide an understanding of the present invention. However, it will be understood by those skilled in the art that the present invention may be practiced without these details. While the invention has been disclosed with respect to a limited number of embodiments, those skilled in the art will appreciate numerous modifications and variations therefrom. It is intended that the appended claims cover such modifications and variations as fall within the true spirit and scope of the invention.

What is claimed is:

1. A memristor, comprising:
a first electrode;
a second electrode parallel to the first electrode; and
a switching layer disposing between the first and second electrode, and containing a conduction channel and a reservoir zone, the conduction channel having a Fermi glass material having a variable concentration of mobile ions, the reservoir zone being laterally disposed relative to the conduction channel and functioning as a source/sink of mobile ions for the conduction channel during a switching operation, in which the mobile ions are moved into or out of the laterally disposed reservoir zone to vary the concentration of the mobile ions in the conduction channel to change a conductivity of the Fermi glass material.

2. A memristor as in claim 1, wherein the Fermi glass material is a solid solution of a metal and the mobile ions.

3. A memristor as in claim 2, wherein the metal is tantalum.

4. A memristor as in claim 3, wherein the mobile ions are oxygen anions.

5. A memristor as in claim 1, wherein the Fermi glass material is selected from the group of oxides, nitrides, sulfides, phosphorides, chalcogenides, carbides, boronides, and fluorides.

6. A memristor as in claim 1, wherein the conduction channel has a shape of a truncated cone, with a narrower end in contact with the second electrode.

7. A memristor as in claim 6, wherein the laterally disposed reservoir zone forms an annular region surrounding the narrower end of the conduction channel.

8. A memristor as in claim 7, wherein the Fermi glass is a solid solution of tantalum and oxygen.

9. A memristor as in claim 8, wherein the reservoir zone contains tantalum oxide.

10. A memristor as in claim 9, wherein the reservoir zone is surrounded by crystallized $Ta_2O_5$.

11. A memristor as in claim 9, wherein the first electrode is formed of tantalum and the second electrode is formed of platinum.

12. A method of switching a memristor having first and second parallel electrodes, a conduction channel disposed between the first and second electrodes and containing a Fermi glass, and a laterally disposed reservoir zone for sourcing and sinking a species of mobile ions, the method comprising:
applying a first switching voltage to the first and second electrodes to turn the memristor ON, the first switching voltage in cooperation with a first thermal effect causing mobile ions to move from the conduction channel towards the laterally disposed reservoir, thereby reducing a concentration of the mobile ions in the Fermi glass material; and
applying a second switching voltage to the first and second electrodes to turn the memristor OFF, the second switching voltage being opposite in polarity to the first switching voltage and in cooperation with a second thermal effect causing mobile ions to move from the laterally disposed reservoir zone towards the conduction channel, thereby increasing the concentration of the mobile ions in the Fermi glass material.

13. A method as in claim 12, wherein the Fermi glass is a solid solution of a metal and oxygen.

14. A method as in claim 13, wherein the metal is tantalum.

15. A method as in claim 13, wherein the first thermal effect is thermophoresis, and the second thermal effect is thermal diffusion.

* * * * *